United States Patent [19]

Plesinger et al.

[11] Patent Number: 4,809,643

[45] Date of Patent: Mar. 7, 1989

[54] GAS DISTRIBUTION SYSTEM FOR MUFFLE-TYPE FURNACES

[75] Inventors: Boris Plesinger, Scottsdale; Lynn H. Brown, Phoenix, both of Ariz.

[73] Assignee: Honeywell Bull Inc., Waltham, Mass.

[21] Appl. No.: 25,258

[22] Filed: Mar. 12, 1987

Related U.S. Application Data

[63] Continuation of Ser. No. 796,673, Nov. 8, 1985, abandoned.

[51] Int. Cl.[4] .............................................. C23C 16/00

[52] U.S. Cl. ................................. 118/715; 239/553.3; 239/557; 239/560; 239/568

[58] Field of Search ................. 239/76, 428, 450, 550, 239/553, , 553.3, 556, 557, 560, 568, 590.3; 431/328; 118/715

[56] References Cited

U.S. PATENT DOCUMENTS

| | | | |
|---|---|---|---|
| 424,852 | 4/1890 | Bradley | 239/557 |
| 2,494,243 | 1/1950 | Houlis | 239/557 |
| 3,156,292 | 11/1964 | Ross | 239/557 |

FOREIGN PATENT DOCUMENTS

| | | | |
|---|---|---|---|
| 1204352 | 11/1965 | Fed. Rep. of Germany | 431/328 |
| 1311022 | 3/1973 | United Kingdom | 431/328 |

*Primary Examiner*—Andres Kashnikow
*Assistant Examiner*—Michael J. Forman
*Attorney, Agent, or Firm*—J. S. Solakian; E. W. Hughes

[57] ABSTRACT

A gas distribution system provides a gas to a chamber comprising a feed tube, having a tube-like configuration with an input and an output. The gas supplied to the input escapes via the output, the output being configured to have a first and second slot opening. The first slot opening has a predetermined first length along the length of the feed tube and has a predetermined first width across the length of the feed tube, and the second slot opening has a predetermined second length along the length of the feed tube and has a predetermined second width across the length of the feed tube. The second slot is contiguous with and abuts the first slot, and further the predetermined second width is smaller than the predetermined first width. The first and second slot configuration provides the gas at the output at a predetermined pressure, the predetermined pressure being reduced from an area near the output. A plenum, having a rectangular box-like configuration with a definable predetermined length and also having an opening corresponding in configuration to the output, receives the gas escaping from the output of the feed tube to temporarily contain the gas in a chamber formed by the plenum. The plenum further has a plurality of orifices such that the gas escaping from the orifices provides a predetermined spray pattern of the gas within the chamber along the length of the plenum, the length of the feed tube and the predetermined length of the plenum being parallel to each other.

2 Claims, 8 Drawing Sheets

GAS DISTRIBUTION SYSTEM FOR MUFFLE-TYPE FURNACES

This is a continuation of co-pending application Ser. No. 796,673, filed on Nov. 8, 1985, now abandoned.

RELATED PATENT APPLICATIONS

The present patent application is relted to U.S. patent application, Ser. No. 06/796,672, filed Nov. 1985, now abandoned, entitled "Non-Precious Metal Furnace with Inert Gas Firing", by B. M. Plesinger, filed on even date herewith and assigned to Honeywell Information Systems Inc., the assignee of the present application, and may be employed with the furnace disclosed therein.

BACKGROUND OF THE INVENTION

This invention relates to a gas distributing system, and more particularly, to a gas sparger for providing a desired spray pattern of a gas, the gas sparger of the present invention being utilized in a muffle furnace for firing multilayered ceramic carriers (or substrates) used to mount and interconnect a plurality of integrated circuit chips.

The currently exists furnaces for firing of precious metals, such as gold. The firing of precious metals can be accomplished in the presence of air (i.e., oxygen) since the precious metals will not oxidize, and atmosphere contaminants will not interfere with the firing of the precious metal. Therefore, the gas distribution system (or gas sparger, or more simply sparger) is of relative importance in controlling the atmosphere within these furnaces. No furnace presently exists which has been designed specifically for the firing of thick film pastes of a non-precious metal, in which the film paste of a non-precious metal can also include an organic vehicle material. (The non-precious metal referred to herein being copper, which is used in the manufacturing processes of a multilayered substrate for mounting electronic circuit components.)

The industry has tried to use the aforementioned precious metal furnaces for firing of thick film paste of a non-precious metal with little success. Many problems have been encountered; specifically, there is an insufficient exhaust system to evacuate the gases from the burnout zone. Also, there exists an insufficient fresh gas distribution system in the burnout and firing zones, the gas distribution system in the burnout zone being the subject matter of the present invention. These problems exist because the organic vehicle contained in the film paste generates substantial amounts of combustion products which needs to be burned off and evacuated. The existing furnaces have two exhaust stacks, one placed in the front end of the burnout zone immediately past the entrance curtains (which is essentially a cold zone) and the other located directly above the barrier separating the burnout zone from the firing zone. In existing furnaces, displacement of the burnout exhaust causes the burn off gas to flow against the substrate movement causing reduced microatmospheres above the substrates causing incomplete burnout and which results in problems such as reduced solderability and loss of adhesion, the substrate(s) being placed on a chain belt which moves through the furnace.

The firing of a thick film paste of a non-precious metal needs to be accomplished in an inert atmosphere; however, oxygen must be used to burn off the organic vehicle otherwise the organic material carbonizes which can cause short circuits in the substrate. Thus, a mixture of nitrogen and oxygen is injected into the burnout zone of the furnace by the gas distribution system of the present invention thereby providing a clean (i.e, free of contaminants) atmosphere, but a careful balance needs to exist to insure the non-precious metal (copper) is not oxidized. Thus, there exists a need for a gas distribution system for use in furnace specifically designed for the firing of a thick film paste of a non-precious metal, wherein the film paste can also include an organic vehicle material.

SUMMARY OF THE INVENTION

Thus, there is provided by the present invention a gas distribution system, for providing a gas to a chamber, which comprises an input delivery element, having a tube-like configuration with an input port and an output port wherein gas supplied to the input port escapes via the output port, for providing a supply of the gas to the output port. The output port is configured to provide the gas at a predetermined pressure, the predetermined pressure being reduced from the pressure within an area near the output port. An enclosure having a box-like configuration with a predetermined length and having an opening corresponding to the output port receives the gas escaping from the output port of the input delivery element providing a chamber to temporarily contain the gas. The enclosure further includes a plurality of orifices such that the gas escaping from the orifices provides a predetermined spray, or flow, pattern of the gas within the chamber along the length of the enclosure.

Accordingly, it is an object of the present invention to provide a gas distribution system.

It is another object of the present invention to provide a gas distribution system for a furnace for firing non-precious metal paste in an inert gas.

It is a further object of the present invention to provide a gas distribution system, for a furnace for firing an element having a non-precious metal paste which includes an organic vehicle material, for supplying fresh gas to the element in order to achieve an effective burnout of the organic material from the element.

It is still another object of the present invention to provide a gas distribution system for a furnace for firing a non-precious metal in an inert gas, wherein the non-precious metal in an inert gas, wherein the non-precious metal paste includes an organic vehicle material.

These and other objects of the present invention will become more apparent when taken in conjunction with the following description and attached drawings, wherein like characters indicate like parts, and which drawings form a part of the present application.

DETAILED DESCRIPTION

Figure 1:
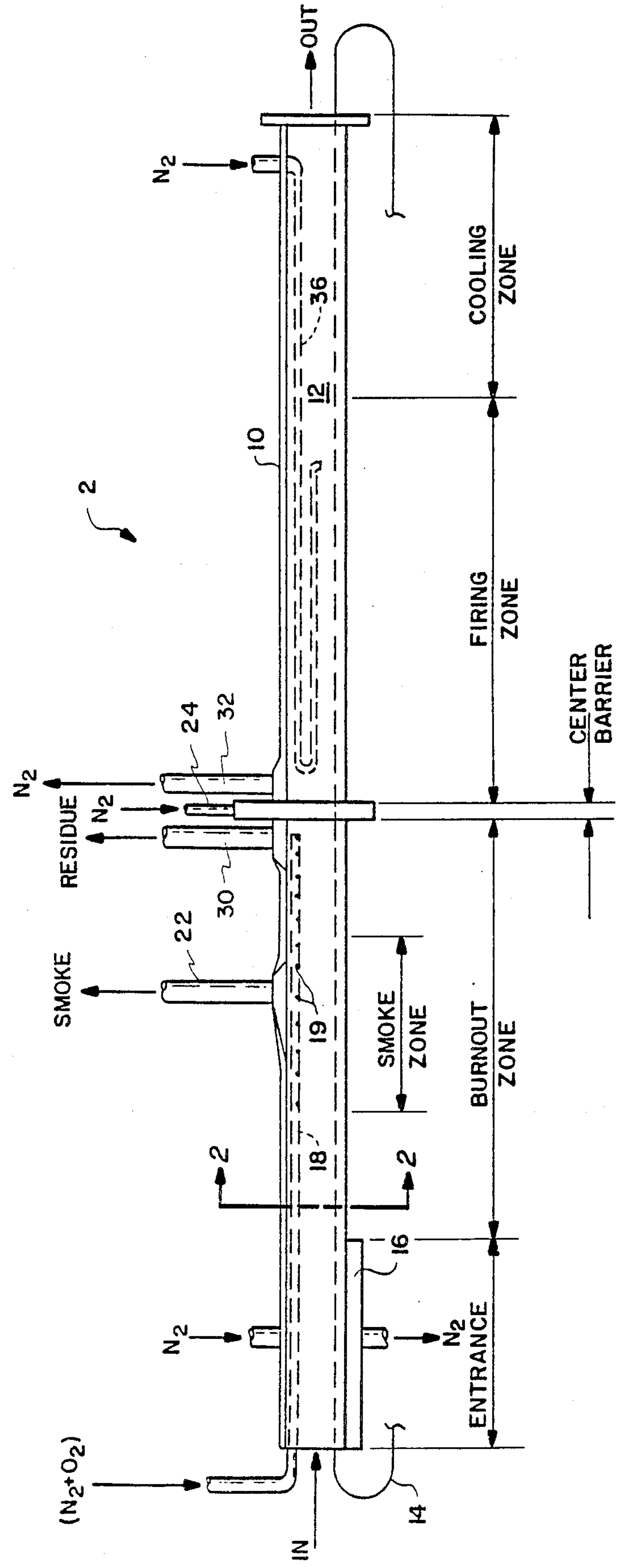
FIG. 1 shows an exterior view of the furnace which can incorporate the gas distribution system of the present invention.

Referring to FIG. 1, there is shown an exterior view of a furnace enclosure 10, the enclosed area thereby defining an interior chamber 12. Ceramic substrates, or more simply substrates, (not shown) to be fired are placed on a chain belt 14, which transports the ceramic substrate (not shown) through the interior chamber 12 of a furnace 2 from an input (IN), or entrance, of the furnace 2 to an output (OUT), or exit, of the furnace 2. The ceramic substrates can include a film paste of a non-precious metal having an organic vehicle material (the non-precious metal of the preferred embodiment being copper) and can also include a PPD (photo sensitive plastic material) which is an organic material. The furnace 2 is divided into various zones (or areas). The various zones of the furnace 2 are described in the related patent application identified above. Of particular interest is the burnout zone, although some of the other zones will be described briefly herein.

The ceramic substrate enters the interior chamber through an entrance area (vestibule) which is effectively a clean zone. The entrance area includes entrance curtains (not shown) which cover the opening of the interior chamber 12. The entrance curtains hang from the upper part of the interior chamber 12 down to the chain belt 14, and are hinged at the top of the interior chamber 12 thereby enabling the ceramic substrate to move past the entrance curtains, the entrance curtains brushing the top surface of the ceramic substrate as it passes through. In addition, in the entrance area, nitrogen ($N_2$) gas (which can be preheated to avoid thermal shock to the substrate) is fed into the interior chamber 12 and extracted immediately below via an exit chamber 16. The purpose of this arrangement is to prevent the intake of ambient air into the interior chamber 12.

From the cleaning zone, the ceramic substrate moves to an area denoted a burnout zone where the temperature within the interior chamber 12 begins to elevate. In the burnout zone, burnout of the organic material occurs. The portion of the burnout zone in which essentially all the smoke is produced as a result of the burnout of the organic material is denoted as the smoke zone. Most of the burnout of the organic material occurs in the smoke zone (i.e., almost all of the smoke is generated in the smoke zone). This is a function of the temperature within the interior chamber 12. In the preferred embodiment, the burnout of the organic material occurs in an area of the interior chamber 12 where the temperature is between 350° to 500° centigrade (C.), hence the temperature of the smoke zone is within this range. The burnout occurs in the presence of a mixture of nitrogen ($N_2$) gas and oxygen ($O_2$). This gas mixture is fed into the interior chamber 12 by a sparger 18, the subject of the present invention.

Figure 2:
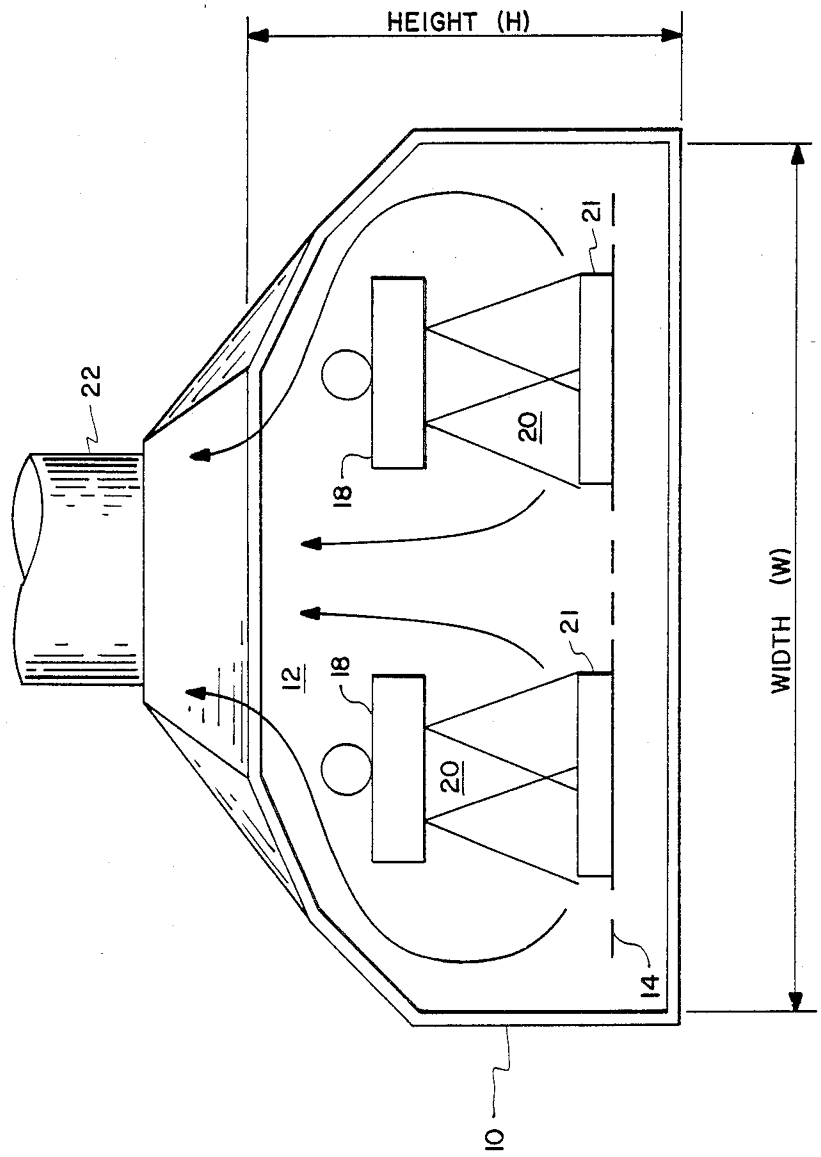
FIG. 2 shows an expanded cross-section view A—A of the furnace of FIG. 1.

The gas sparger 18 is a gas distribution device (or a gas spraying device) which sprays the nitrogen and oxygen gas mixture in a spray pattern 20 as shown in FIG. 2. Referring to FIG. 2, there is shown a cross section view 2—2 (expanded) of the furnace of FIG. 1. The gas sprayed provides uniform coverage of the ceramic substrates 21 with the incoming nitrogen and oxygen gas mixture while reducing the disruptive gas flows within the interior chamber 12. The details of the preferred embodiment of the gas sparger 18 of the present invention which produce the desired spray pattern are more fully described hereinunder.

The roof of the furnace along the smoke zone is funneled up to aid the exhaust flow upward and away from the substrate 21. An exhaust opening is provided in the roof of the furnace wall at the vertex of the funnel and includes a first stack 22 above the smoke zone thereby providing for evacuation of the smoke generated in the immediate area. Also, the first exhaust (or the smoke exhaust) stack 22 is at a relatively high temperature thus preventing condensation of any contaminants contained in the smoke such as a tacky tar-like substance. The diameter of the stack is a function of the amount of smoke to be carried away or evacuated. This amount can be calculated analytically or determined empirically. All the stacks in the furnace are regulated exhausts, (although they need not be); the technique of regulating the exhaust can be by any one of the many techniques well known to those skilled in the art. The regulation of the stacks will aid in determining the gas flow in the interior chamber 12 of the furnace 2.

Still referring to FIG. 2, the roof of the furnace 2 has a hipped configuration to improve gas flow patterns. This configuration causes less disruptive gas flows in conjunction with the gas sparger 18 distribution to be described in detail hereinunder, and promotes better exhaust gas flows. For the best exhaust flow, the ideal shape would be a round roof; specifically half of a cylindrical ellipsoid, or alternatively a portion of a circular cylinder rather than the rectangular shape of existing furnaces. Because of manufacturing difficulties, the "double hipped roof" was utilized in the preferred embodiment of the present invention. This shape is a compromise between the circular and elliptical cylinder and is relatively easy to manufacture. The dimensions are such that the roof lines are tangential to the periphery of an ellipse. In the preferred embodiment angle A is 45° and angle B is 22½°. Although the preferred embodiment has a 1:2 aspect (i.e., the height (H) to the width (W)), this aspect is not required. What is important is that no dead spots or gas turbulence occurs and that the exhaust gasses flow away from the ceramic substrates 21.

Referring back to FIG. 1, before the ceramic substrates pass to the firing zone, the ceramic substrates pass a center barrier. The center barrier provides a spraying of nitrogen gas (preheated within) which removes any residue smoke trapped on or under the ceramic substrate. This is accomplished by providing a nitrogen gas distributor 24 which supplies the center barrier area of the interior chamber 12 with the inert gas and controls the gas flow within the interior chamber 12 in order to provide a desired flow pattern. The residue gases are extracted from a second stack, a residue exhaust stack 30, and nitrogen gas which is inserted into the firing zone is exhausted via a third stack, a nitrogen exhaust stack 32. The nitrogen gas distributor 24 within the center barrier provides a barrier such that the firing zone is free of the nitrogen and oxygen gas mixture.

As the ceramic substrate enters the firing zone, the non-precious metal and the dielectric is sintered. The sintering process is done in an inert gas atmosphere, provided by a second gas sparger 36 inserted into the firing zone. The exit portion of the furnace also has a positive pressure of inert gas (although not specifically shown), such that the ambient air cannot enter the interior chamber 12. The total length of the furnace is given by the process of temperature/time of the materials.

Figure 3:
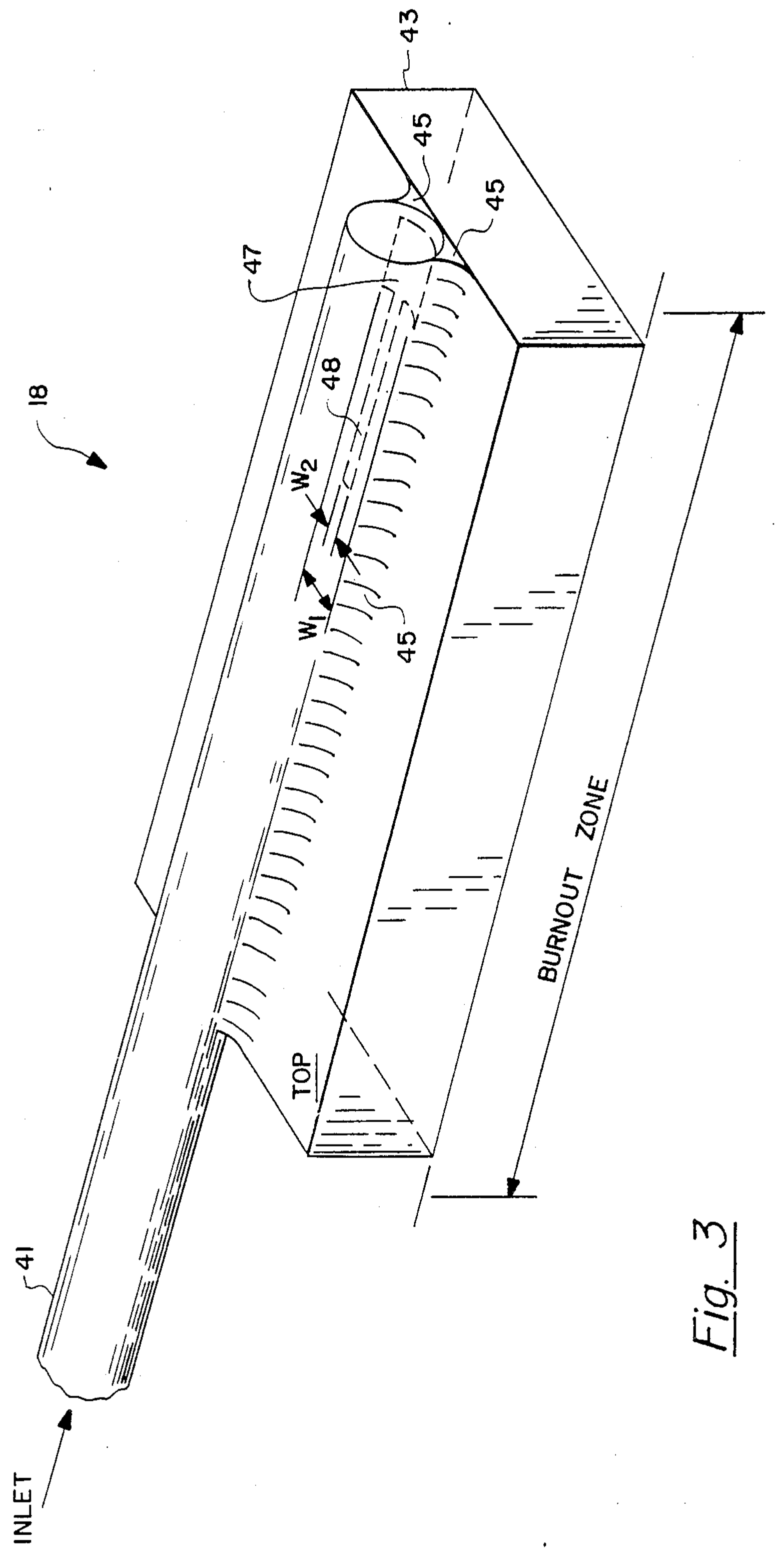
FIG. 3 shows a three dimensional view of a gas sparger of the present invention.
Figure 3C:
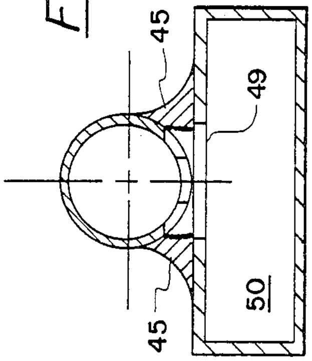
FIG. 3C shows a sectional view 3C—3C of the sparger of FIG. 3B.
Figure 3A:
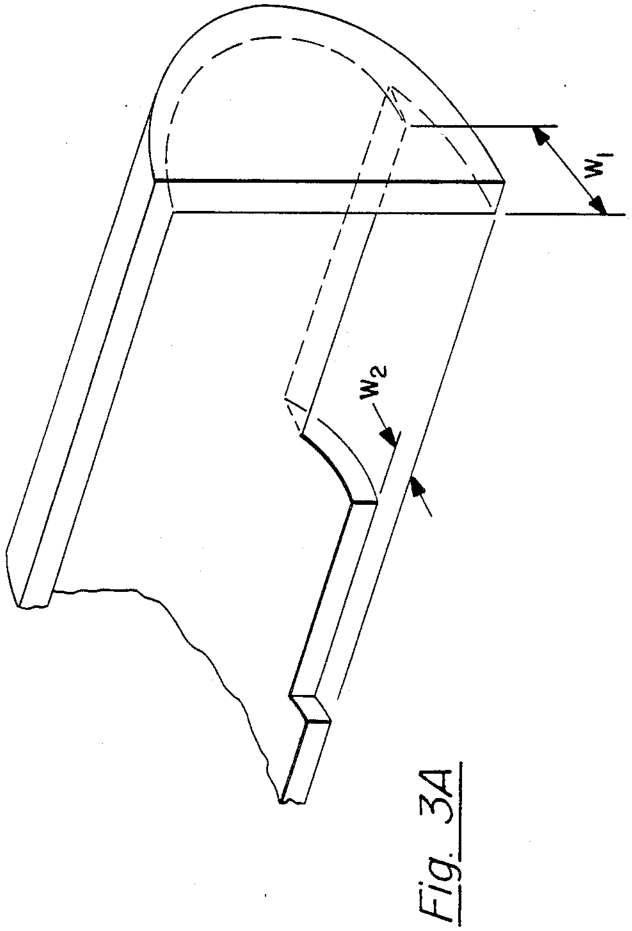
FIG. 3A shows a three dimensional cut-away view of a first and second slot.
Figure 3B:
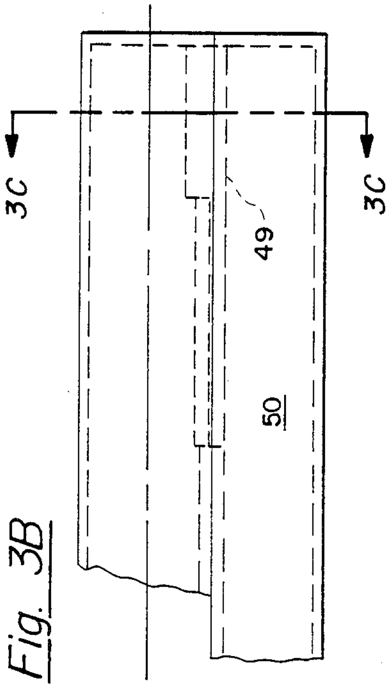
FIG. 3B shows a front view of the slots.

Referring to FIG. 3, there is shown a 3-D view of the gas sparger 18 of the present invention viewing the sparger from the top. The gas sparger 18 comprises a feed tube 41 and a plenum 43, the feed tube 41 being affixed to the top surface of the plenum 43, the plenum 43 having a rectangular box-like configuration. In the preferred embodiment of the present invention, the feed tube 41 is welded to the plenum 43, leaving some weld material 45. The length of the plenum 43 is such that it is within almost all of the burnout zone. The gas mixture, in the preferred embodiment being essentially a nitrogen gas doped with a predetermined quantity of oxygen gas, is delivered into the inlet of the feed tube which extends along the length of the interior chamber 12 from the burnout zone to the entrance (IN). By feeding the gas mixture in this manner, the nitrogen gas (which is usually fed from frozen tanks) is preheated as it passes through the length of the furnace before it enters the interior chamber 12. The gas mixture exits the feed tube 41 and enters the plenum 43 via a first slot 47, and a second slot 48. The first slot 47 is an opening along the length of the feed tube and has a first width $W_1$ along the circumference of the feed tube 41 which is essentially against the top surface (TOP) of the plenum 43. A second slot 48 has an opening contiguous with the first slot 47 along a length of the feed tube 41 and has a second width ($W_2$) along the circumference of the feed tube 41, the second width being substantially smaller than the first width. FIG. 3A shows a three-dimensional (3-D) cut-away view of the first and second slot 47, 48, and FIG. 3B shows a front view of the slot and FIG. 3C shows a sectional view 3C—3C of the feed tube 41 and the plenum 43 including the first and second slot areas 47, 48. The weld material 45 provides a seal allowing the gas mixture to escape only into the plenum 43. The top surface of the plenum 43 contains an opening 49 which corresponds to the overall length of the first and second slot and having a width $W_1$ for allowing the gas mixture which escapes from the feed tube 41 to enter into the plenum chamber 50.

Figure 4:
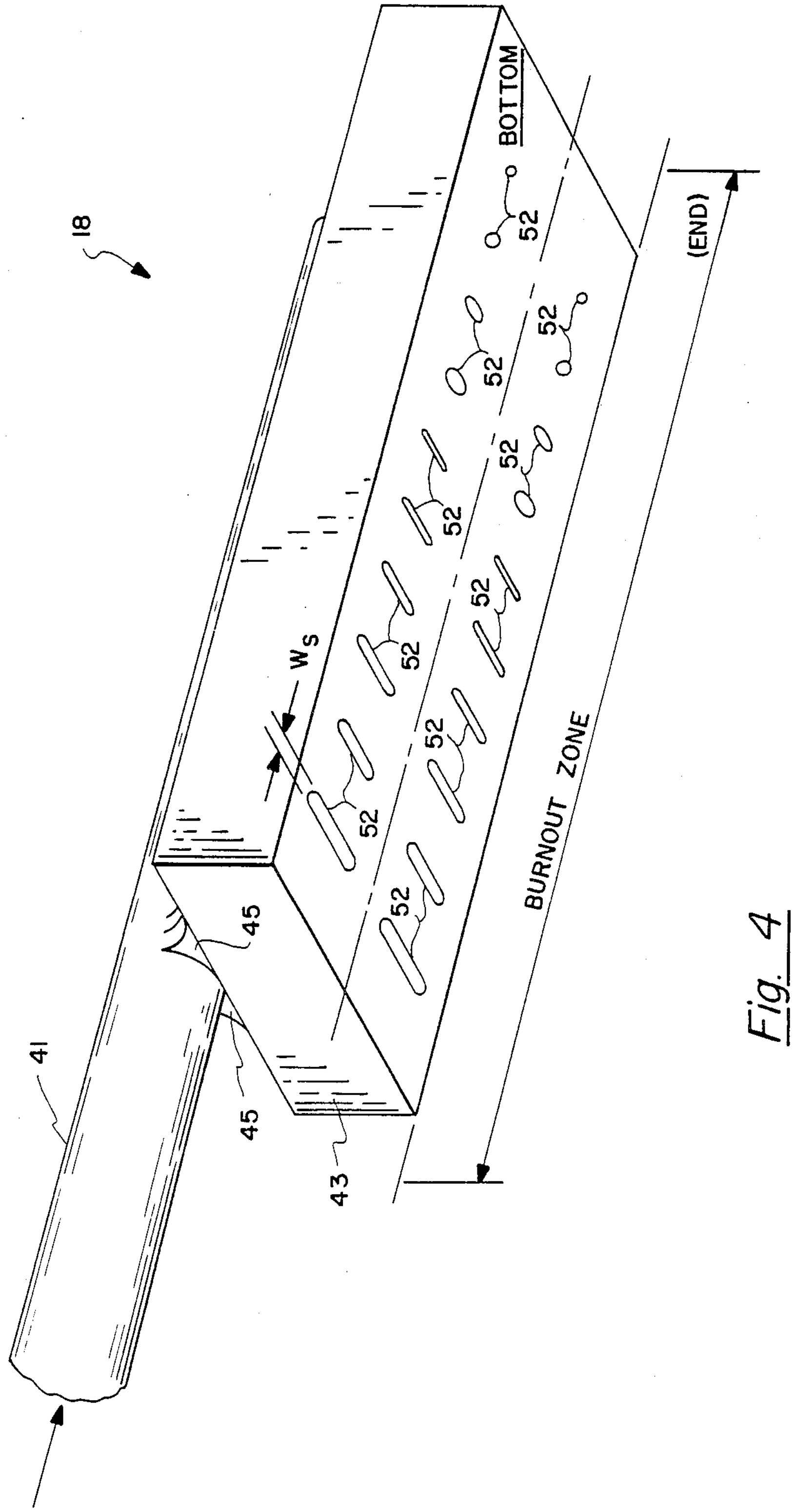
FIG. 4 shows a three dimensional bottom view of the gas sparger of the present invention.

Referring to FIG. 4, there is shown a 3-D view of the gas sparger 18 of the present invention, viewing the gas sparger 18 from the bottom. The gas mixture which enters the plenum chamber 50 exits into the interior chamber 12 of the furnace tube via openings, or orifices 52, of the gas sparger 18. In the preferred embodiment of the present invention, the orifices 52 are arranged in two rows along the length of the bottom surface (BOTTOM). Corresponding orifices 52 of each row are small circular openings, the diameter of the opening increasing slightly as a function of its distance from the end of the plenum 43 (the end of the plenum being that end nearest the end of the burnout zone). At a predetermined distance from the end of the plenum, the orifices change configuration to that of slots having a width $W_s$. The width of each corresponding slot increases in width slightly as its distance from the end of the plenum 43 increases.

The configuration of the gas sparger 18 of the preferred embodiment of the present invention provides a fresh gas mixture to the substrate 21. Further, the gas mixture distribution is essentially perpendicular to the plane of the substrate 21 such that at any given point the substrate will have a fresh gas mixture sprayed onto it, and essentially no contaminated gas is blown across the surface of the substrate. By inputting the gas mixture through the interior chamber 12 via the feed tube 41, the gas mixture has time to get preheated, expanded, and discharged, into a plenum chamber 50. The second slot 48 causes a pressure drop into the plenum chamber 50 at the end of the plenum chamber, allowing the orifices 52 nearest the end of the plenum 43 to be operative. The configuration of the orifices need not be circular or slotted, but need to be such that the gas mixture velocity and volume escaping from the plenum 43 into the interior chamber 12 are equalized along the length of the burnout zone. The configuration of the preferred embodiment of the present invention provides this equalization.

Figure 5:
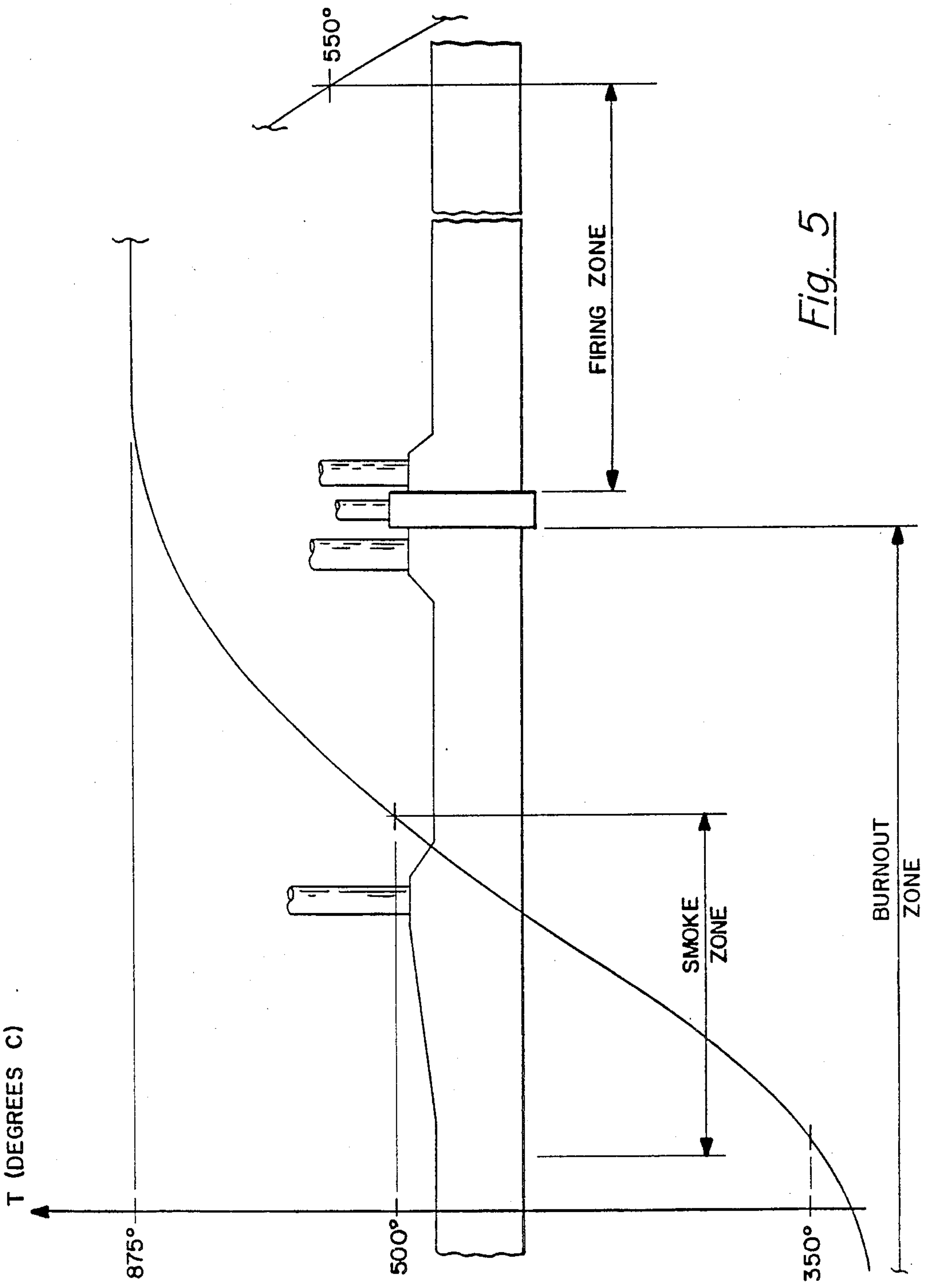
FIG. 5 shows a temperature profile through the interior chamber of the furnace.

Referring to FIG. 5, the temperature profile through the interior chamber of the furnace 2 is shown for the gas furnace described above. It can be seen that the area of the furnace past the smoke zone but still within the burnout zone is a higher temperature than in the smoke zone, and thus oxidation of the non-precious metal is more likely to occur in the presence of a gas mixture having a high concentration of oxygen doping. Hence, it may be desirous to divide the burnout zone such that two different gas mixtures are provided within the burnout zone.

Figure 6:
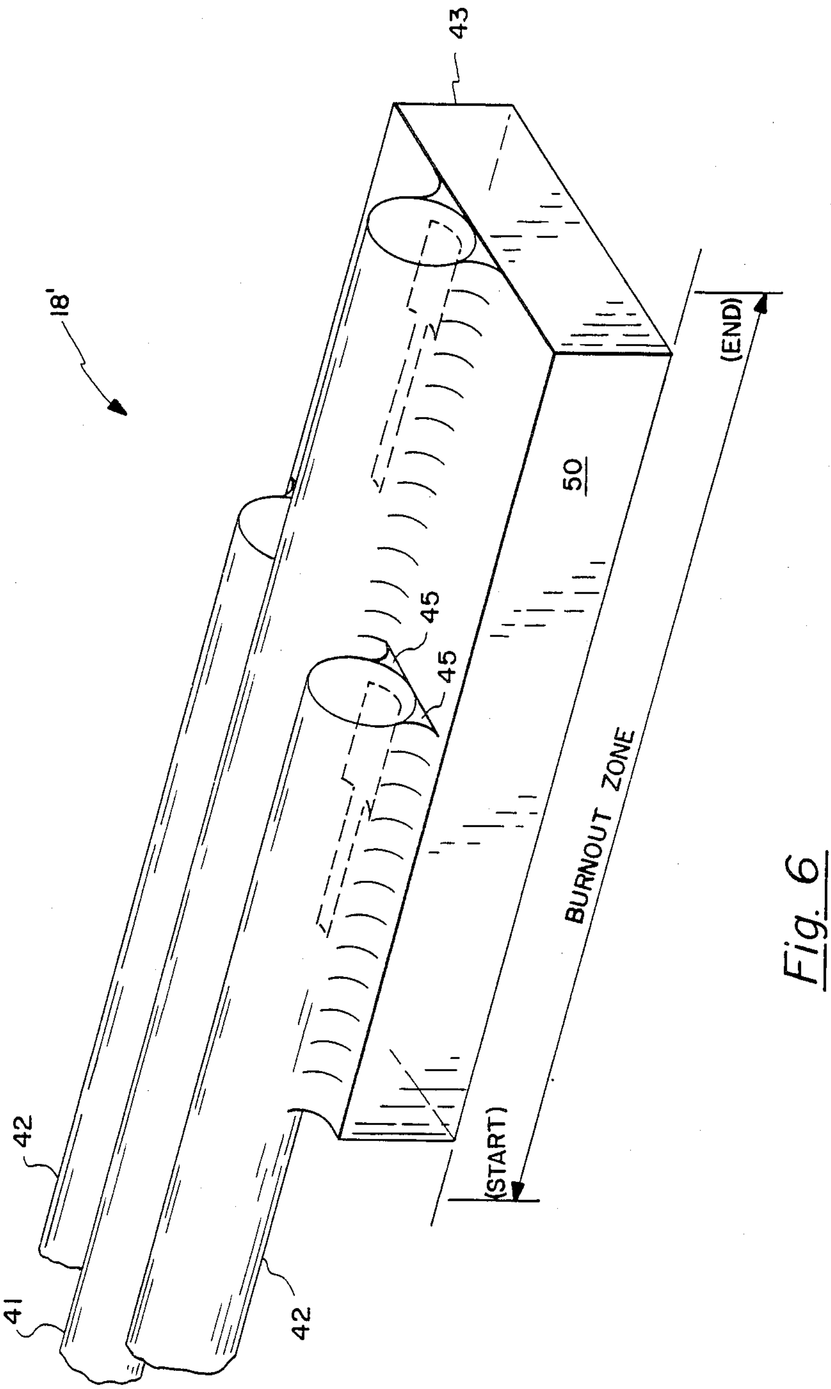
FIG. 6 shows an alternative embodiment of the gas sparger of the present invention.

Referring to FIG. 6, there is shown an alternative embodiment of the present invention which allows the interior chamber 12 of the furnace to be divided such that one part can contain one oxygen doping value and another part of the interior chamber 12 can have a second oxygen doping value.

Figure 6A:
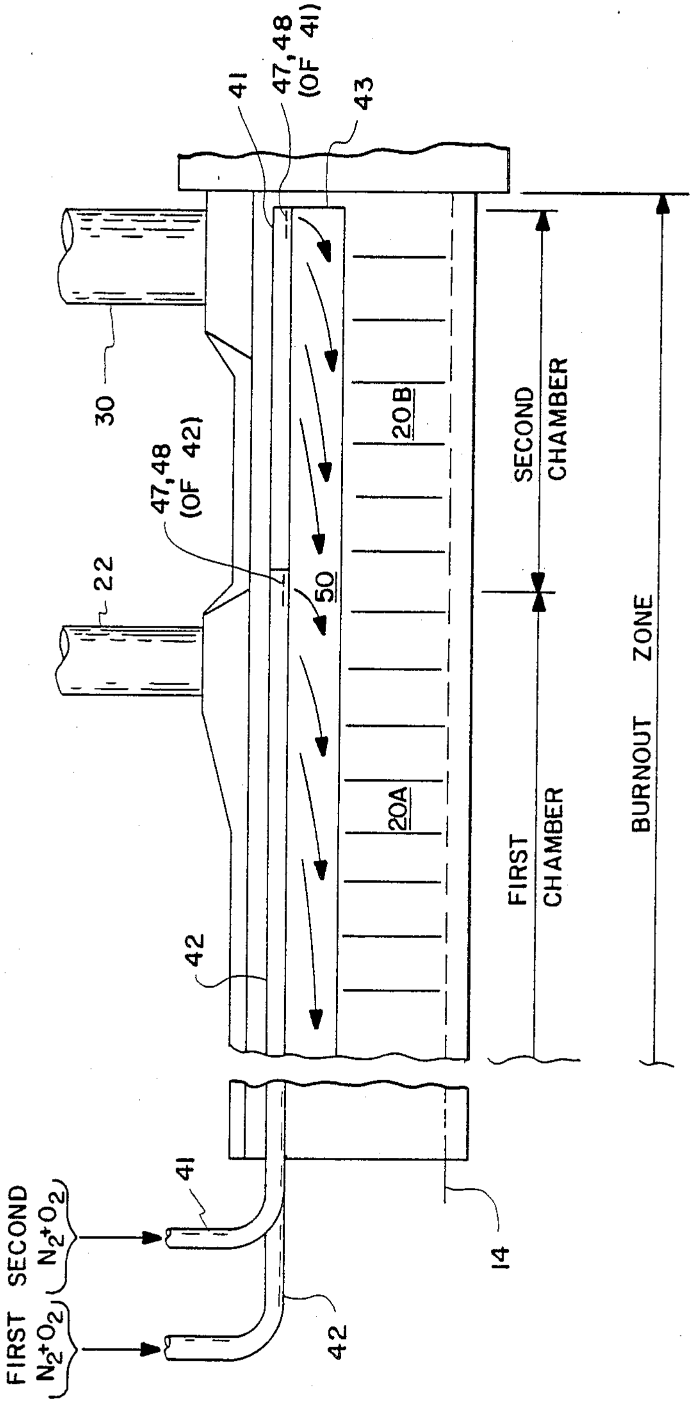
FIG. 6B shows an interior view of the interior chamber of the furnace, which includes the gas sparger of FIG. 6 and the gas flow and spray resulting therefrom, thereby dividing the interior chamber.

FIG. 6 shows a 3-D view of an alternative embodiment of the gas sparger 18'. The gas sparger 18' includes a first feed tube 41 and a dual second feed tubes 42, each feed tube being affixed to the top surface of a plenum 43, the plenum having a rectangular box like configuration. The first feed tube 41 extends to the end of the plenum 43, the end of the plenum corresponding to the end of the burnout zone (END). The dual second feed tubes 42 extend part way along the length of the plenum 43 ending at a point where it is desirous to the interior chamber to be divided into the two chambers mentioned above. Each feed tube has a slotted configuration as described above for allowing the gas mixture to enter the plenum chamber 50. Due to the gas flow and pressures within the plenum chamber 50, the gas escaping from the plenum chamber 50 into the interior chamber 12 (i.e., the burnout zone) will not mix thereby dividing the burnout zone into two chambers. Thus, as shown in FIG. 6A (an interior view of the burnout zone), if the dual second feed tubes 42 have inputted a gas mixture of a first level of oxygen gas doping (e.g., 100 ppm), and the first feed tube 41 has inputted a gas mixture with a second level of oxygen gas doping (e.g., 8 ppm), the burnout zone will be divided into a first and second chamber as shown. Thus, the first chamber will contain a first spray 20A having sufficient oxygen gas to allow burn off, and the second chamber will contain a second spray having sufficient oxygen gas to allow burn off of any residue and yet have a low enough oxygen gas level to avoid oxidation of the non-precious metal.

While there has been shown what is considered the preferred embodiment of the present invention, it will be manifest that many changes can be made therein without departing from the essential spirit and scope of the invention. It is intended, therefore, in the annexed claims to cover all such changes and modifications which fall within the true scope of the invention.

We claim:

1. A gas distribution system, for providing a gas to a chamber to spray components on a belt moving through said chamber comprising:

(a) a feed tube, having a tube-like configuration having a length with a first end and a second end, and wherein the tube-like configuration includes a cylindrical surface, and an input and an output, the input being at the first end of the feed tube and the output being at the second end of the feed tube and further the output being an opening of the cylindrical surface, wherein gas supplied to said input exits via the output and further wherein the output is configured to have a first and second slot opening, the first slot opening having a predetermined first length along the cylindrical surface and paralleled to an element of the cylindrical surface and having a predetermined first width perpendicular to the length of the feed tube, and the second slot opening having a predetermined second length along the cylindrical surface and parallel to the element of the cylindrical surface and having a predetermined second width perpendicular to the length of the feed tube, said second slot being contiguous with and abutting the first slot, and the first slot being further away from the input port, and further wherein the predetermined second width is smaller than the predetermined first width, the first and second slot being configured to provide the gas at the output at predetermined pressures, the pressure of the gas exiting from the first slot being lower than hat of the gas exiting from the second slot; and (b) a plenum, having a rectangular box-like configuration with a top surface and with a predetermined length and also having an opening of the top surface, the opening having a geometric configuration which corresponds to the configuration of the output of said feed tube, an element of the cylindrical surface of the feed tube being essentially in contact with the top surface of the plenum and affixed thereto, and further positioned such that the opening of the plenum is in juxtaposition with the output of the feed tube, allowing the plenum to receive the gas exiting from the output of the feed tube, the plenum providing a chamber to temporarily contain said gas, the plenum further having a plurality of orifice means for discharging gas in such a manner as to provide a predetermined pattern of said gas flow within said chamber along the length of said plenum to minimize turbulence and further whereby the components between the plenum and the belt are sprayed with a continual fresh supply of gas as they move through a predetermined portion of the chamber.

2. A gas distribution system of a furnace for firing multilayer substrates, said system directing a gas onto substrates moving thorough the furnace on conveyor means; said system comprising:

(a) tubular means having alength, a first end, a second end, and a cylindrical surface, an input port at the first end and output port means formed at the second end, said output port means for discharging gas supplied to the input port under pressure, so that the pressure of the gas exiting the output port means furthest from the input port is less than that of the gas exit exiting nearest the input port, said output port means including a first slot formed in the cylindrical surface of the tubular means having a predetermined first length parallel to the length of the tubular means and a predetermined first width, and a second slot formed in said surface having a predetermined second length and a predetermined second width, said second slot being contiguous to and abutting said first slot;

(b) a box-like enclosure means having a top and a bottom surface, a predetermined length, and an opening in the top surface which corresponds in size and shape with the slots of the output port means of the tubular means, the tubular means, along the cylindrical surface, being in contact with and affixed to the top opening of the enclosure means in juxtaposition to the outlet port means, a plurality of orifice gas discharge means formed in the bottom surface of the box-like enclosure means for discharging gas into the furnace in a predetermined flow pattern, said orifice gas discharge means extending the length of the enclosure means, said flow pattern immersing the surfaces of substrates between the conveyor means and the bottom surface of the enclosure means in gas discharged from the enclosure means which flow pattern minimizes turbulent flow of the gases in the furnace in the vicinity of the enclosure means.

* * * * *